United States Patent
Iwawaki et al.

(10) Patent No.: US 8,071,993 B2
(45) Date of Patent: Dec. 6, 2011

(54) ORGANIC ELECTROLUMINESCENCE ELEMENT, IMAGE DISPLAY DEVICE, AND IMAGING APPARATUS

(75) Inventors: Hironobu Iwawaki, Yokohama (JP); Mizuho Hiraoka, Kawasaki (JP); Hiroki Ohrui, Kawasaki (JP); Masumi Itabashi, Kodaira (JP); Masanori Muratsubaki, Hachioji (JP); Naoki Yamada, Inagi (JP); Kei Tagami, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 100 days.

(21) Appl. No.: 12/511,368

(22) Filed: Jul. 29, 2009

(65) Prior Publication Data
US 2010/0059739 A1 Mar. 11, 2010

(30) Foreign Application Priority Data

Jul. 31, 2008 (JP) ................. 2008-197970
Jun. 23, 2009 (JP) ................. 2009-149070

(51) Int. Cl.
*H01L 33/00* (2010.01)
(52) U.S. Cl. ............ 257/98; 257/E33.001; 438/29
(58) Field of Classification Search ............ 257/98, 257/E33.001; 438/29
See application file for complete search history.

(56) References Cited

U.S. PATENT DOCUMENTS

| 2003/0057827 A1* | 3/2003 | Kido et al. ............ 313/504 |
| 2005/0079385 A1* | 4/2005 | Nomura et al. ............ 428/690 |
| 2007/0154735 A1* | 7/2007 | Nakayama ............ 428/690 |
| 2008/0157657 A1* | 7/2008 | Matsunami et al. ............ 313/504 |

FOREIGN PATENT DOCUMENTS
JP 2002-175885 A 6/2002
* cited by examiner

*Primary Examiner* — Steven J Fulk

(57) ABSTRACT

An organic electroluminescence element includes organic compound layers disposed between electrodes, the concentration of halogen atoms contained in organic compounds of the organic compound layers being 1 ppm or less according to combustion ion chromatography.

5 Claims, 1 Drawing Sheet

ORGANIC ELECTROLUMINESCENCE ELEMENT, IMAGE DISPLAY DEVICE, AND IMAGING APPARATUS

BACKGROUND OF THE INVENTION

1. Field of the Invention

The present invention relates to an organic electroluminescence element including a host material containing an alkyl group as a substituent with a specified structure.

2. Description of the Related Art

In recent, organic electroluminescence elements have been significantly improved and widely applied to displays and illuminations because of the possibilities of low power consumption, high luminance, enlargement of a color reproduction range due to diversification of emission wavelength, rapid response, lighter weight, and thinner size.

It is known that luminance of an organic electroluminescence element decreases with time due to the low purity of an organic compound.

Japanese Patent Laid-Open No. 2002-175885 discloses an organic electroluminescence element including at least one organic compound layer formed using an organic compound material which contains impurities composed of a halogen-containing compound at a concentration of less than 1000 ppm. Further, an organic electroluminescence element formed using an organic compound material containing less than 500 ppm of impurities is disclosed.

However, these techniques cannot sufficiently secure durability in driving for a long time.

SUMMARY OF THE INVENTION

The present invention provides an organic electroluminescence element including an anode, a cathode, a luminescent layer containing an organic compound, and an organic compound layer other than the luminescent layer, the luminescent layer and the other organic compound layer being disposed between the anode and the cathode so that light is emitted from the luminescent layer by charge injection from the anode and the cathode. The luminescent layer includes a host material and a guest material, both the host material and the guest material are organic compounds composed of only carbon and hydrogen, and the host material is an organic compound having an alkyl group-containing aromatic ring. The concentration of halogen atoms contained in at least the luminescent layer is 1 ppm or less in terms of the organic compounds contained in the luminescent layer and the other organic compound layer according to combustion ion chromatography.

The present invention can provide an organic electroluminescence element with high efficiency, high luminance, and little attenuation of emission luminance even when a luminescent layer includes a host material having an alkyl group-containing aromatic ring.

Further features of the present invention will become apparent from the following description of exemplary embodiments with reference to the attached drawings.

DESCRIPTION OF THE EMBODIMENTS

Figure 1:
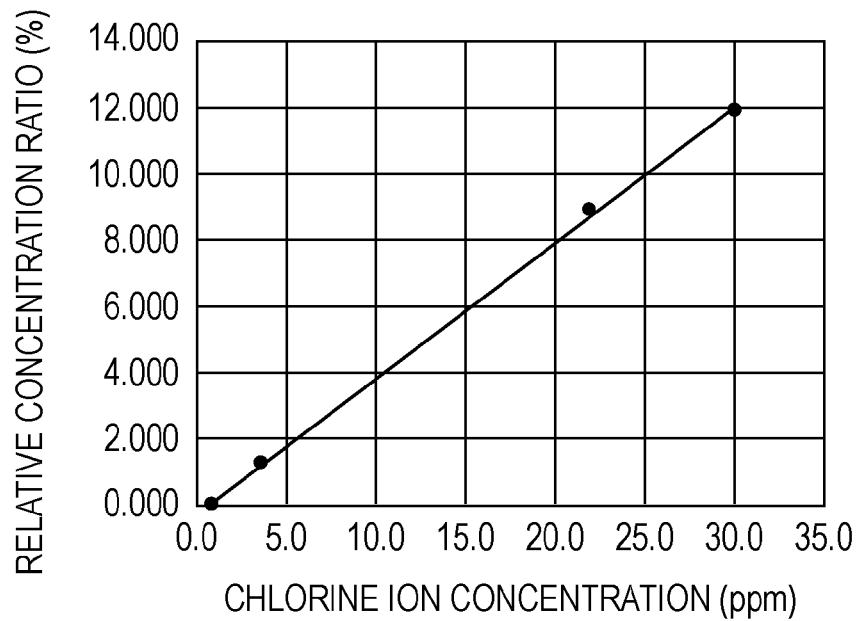
FIG. 1 is a graph showing a relationship between the chlorine ion concentration and relative concentration ratio of a chlorine substitution product.

An organic electroluminescence element includes, as components, at least an anode, a cathode, and a luminescent layer composed of an organic compound and disposed between the anode and the cathode. When carriers, i.e., holes and electrons, are supplied to the luminescent layer from the anode and the cathode, a luminescent material contained in the luminescent layer is excited by recombination of the holes and electrons, and light is emitted when the excited luminescent material is put into the ground state.

The present invention provides an organic electroluminescent element which causes little attenuation of emission luminance even when light is continuously emitted over a long time.

Therefore, the inventors paid attention to the following: A luminescent layer is formed as an electron trap type. An electron trap-type luminescent layer is a type in which electrons supplied from a cathode are supplied in a large amount to a guest material. In the present invention, a luminescent layer includes at least a host material as a main component in view of weight and a guest material as a secondary component. The electron trap-type luminescent layer is distinguished from a hole trap-type luminescent layer and a bipolar-type luminescent layer. The hole trap-type luminescent layer is a type in which holes supplied from an anode are supplied in a large amount to a guest material. The bipolar-type luminescent layer is a type in which electrons and holes are supplied in a large amount to a guest material.

The electron trap-type luminescent layer causes little attenuation of emission luminance in continuous emission over a long time as compared with the hole trap-type luminescent layer. Both the host material and the guest material in the electron trap-type luminescent layer are composed of only carbon atoms and hydrogen atoms. In other words, both the host material and the guest material in the electron trap-type luminescent layer do not contain nitrogen atoms or oxygen atoms.

When both the host material and the guest material are composed of only carbon atoms and hydrogen atoms, LUMO (Lowest Unoccupied Molecular Orbital) of the guest material can be made lower than LUMO of the host material. That is, LUMO of the guest material can be shifted away from the vacuum level. As a result, electrons supplied from the anode are more easily accumulated in the guest material than in the host material.

Next, the inventors paid attention to the fact that in order to provide an organic electroluminescence element causing little attenuation of emission luminance even in continuous emission over a long time, it is necessary for a host material to have high amorphousness.

That is, the inventors paid attention to the fact that in order to increase amorphousness, it is effective to add an alkyl group to the host material.

Namely, the inventors paid attention to the fact that it is important to prevent crystallization of the luminescent layer. In addition, the inventors found that in order to prevent crystallization of the host material as the main component, it is important to make a technique for providing a highly bulky substituent to the host material. As an alkyl group, an isopropyl group, a tertiary butyl group, a normal butyl group, an adamantyl group, and the like, particularly a tertiary butyl group, can be used. As the host material, a compound having an aromatic ring, specifically a pyrene ring or a fluorene ring, can be used. As the host material, a material having an alkyl group-containing pyrene ring as an aromatic ring can be used.

The inventors further paid attention to the fact that the halogen atom concentration in the luminescent layer is 1 ppm or less according to combustion ion chromatography. The inventors found that under such a condition, decrease of luminance with time of an organic electroluminescent element is extremely small. This is because halogen atoms are likely to adversely affect, e.g., decompose or the like, the guest material.

As described above, the halogen atom concentration in the luminescent layer is 1 ppm or less. In addition, in the present invention, the halogen atom concentration is defined for all organic compound layers provided between the anode and the cathode. That is, the halogen atom concentration of all organic compounds contained in organic compound layers including the luminescent layer, i.e., the total concentration, is 1 ppm or less. This is because such definition is simple and rational for measurement of halogen atoms in an organic electroluminescence element.

When the halogen concentration in the organic electroluminescence element is measured, for example, the organic electroluminescence element is decomposed. In this case, organic compounds between the cathode and the anode are recovered at a time with a solvent or the like and separated by a separation method such as column chromatography or the like. It is simple and rational to measure the halogen atom concentration through such a separation process.

The present invention does not include the case in which the luminescent layer contains substantially no halogen atom, other organic compound layers contain halogen atoms, and the halogen atom concentration in all organic compounds between the electrodes is 1 ppm or less.

Such a case certainly has the possibility that halogen atoms move from the other organic compound layers to the luminescent layer and adversely affect the guest material. However, the present invention is premised on a condition in which the host material is an organic compound having an alkyl group-containing aromatic ring, and is thus distinguished from the above case.

Namely, in the present invention, halogen atoms are derived from a halogen substitution product of the host material.

Halogen atoms contained in the luminescent layer are derived from a halogen substitution product of the host material. The expression "halogen atoms contained in the luminescent layer" represents halogen atoms contained in a halogen substitution product of the host material and halogen atoms contained in a compound produced by decomposition of a halogen substitution product of the host material. The expression also represents halogen atoms contained a raw material or halogen atom elements for synthesizing the alkyl group-containing host material.

The inventors consider that halogen atoms are undesired to be contained in the luminescent layer. On the other hand, when an organic compound having an alkyl group-containing aromatic ring is synthesized, more specifically when an organic compound having an aromatic ring is alkylated, halogen is used. In the present invention, it was found that it is effective to use a host material from which the halogen used is sufficiently removed.

That is, the organic electroluminescence element of the present invention includes the electron trap-type luminescent layer which contains the host material and the guest material both composed of only carbon and hydrogen. In addition, the host material is an organic compound having an alkyl group-containing aromatic ring, and halogen atoms are sufficiently removed from the host material. As a result, the organic electroluminescence element has the effect of significantly preventing decrease in emission luminance with time.

In order to introduce an alkyl group in an aromatic ring, for example, Friedel-Crafts reaction is used.

The Friedel-Crafts reaction uses a Lewis acid, a halogenated solvent, and an alkyl halide. In this reaction, a halogen substitution product is synthesized as a by-product.

More specifically, a halogen substitution product in which a halogen, not an alkyl group, is bonded to an aromatic ring of an organic compound having an alkyl group and an aromatic ring is synthesized as a by-product.

Therefore, when the synthesized organic compound is used for the organic electroluminescence element, the halogen substitution product is sufficiently removed from the organic compound material by purification.

The degree of attenuation of emission luminance is evaluated using a relative intensity ratio of emitted light. The relative intensity ratio is a ratio of emission luminance predetermined time after to the initial emission luminance of the organic electroluminescence element.

In the present invention, the relative intensity ratio is a ratio of luminance 100 hours after time zero to the initial luminance, i.e., luminance at time zero, when the organic electroluminescence element is driven at a constant current of 100 $mA/cm^2$.

In the present invention, the halogen atom concentration is not measured by high-performance liquid chromatography alone. This is because it was found that even when an organic compound showing a halogen atom concentration of 500 ppm or less as a result of measurement by high-performance liquid chromatography is used for an element, a high relative intensity ratio is not shown. This is described later in comparative examples.

In Example 2 described below, the total concentration of halogen atoms contained in organic compound materials is 0.9 ppm, and experiment results at 1.0 ppm are not described.

However, as a result of various experiments, the inventors confirmed that in order to allow the organic electroluminescence element to have a high relative intensity ratio, it is important that the total concentration of halogen atoms is 1 ppm or less.

As described below in Comparative Example 1, when the total concentration of halogen atoms contained in organic compound materials is 3.6 ppm, the relative intensity ratio is less than 0.9.

Further, as described in Comparative Example 6 (refer to Table 3) below, when the total concentration of chlorine atoms is 1.6 ppm exceeding 1.0 ppm, the relative intensity ratio is as low as 0.10. If the total concentration of chlorine ions measured by combustion ion chromatography far exceeds 1.0 ppm, for example, 500 ppm, the relative intensity ratio of the organic electroluminescence element is extremely lower than 0.10. Therefore, such an element is an element with a very low relative intensity ratio.

A calibration curve can be used for determining the concentration of halogen atoms. A calibration curve can be determined by high-performance liquid chromatography and combustion ion chromatography. Once the calibration curve is obtained, an absolute concentration of halogen atoms can be determined only by high-performance liquid chromatography.

In manufacturing an organic electroluminescence element, manufacture conditions can be previously determined using the calibration curve. As a result, the manufactured organic electroluminescence element need not be inspected.

The combustion ion chromatography compensates for the limitation of concentration detection by high-performance liquid chromatography.

In high-performance liquid chromatography, a concentration is shown by a relative concentration ratio. The high-performance liquid chromatography is a measurement method using an absorbance of a sample or photoluminescence. In this case, measurement is influenced by the light absorption properties or light emission properties of a sample, resulting in limitation in measurement of a absolute amount of a sample. In particular, when the concentration of a small amount of sample is measured, it is very difficult to measure the concentration due to low light absorption properties or light emission properties of the sample.

In contrast, in the combustion ion chromatography, a sample is decomposed to the element level by combustion, and an absolute amount of element can be measured. Therefore, even when the concentration of a small amount of sample is measured, an absolute amount can be measured.

More specifically, in the combustion ion chromatography, an organic compound in a solid state is first decomposed by combustion. The generated gases are absorbed by an absorption liquid (e.g., ultrapure water), and the absorption liquid is analyzed by ion chromatography. Thus, a small amount of halogen contained in the organic compound is measured as ions. Measurement by combustion ion chromatography uses an apparatus including a sample combustion apparatus and an ion chromatography analyzer.

Therefore, the following technique can be considered.

That is, a sample is measured by high-performance liquid chromatography to determine a relative concentration. An absolute concentration of the sample can be determined from the relative concentration and a calibration curve. Namely, once the calibration curve is obtained, an absolute amount can be determined only by high-performance liquid chromatographic measurement.

Of course, an absolute concentration of a sample can be determined only by combustion ion chromatography without using the calibration curve.

From this knowledge, the upper limit of the total concentration of halogen atoms of the organic electroluminescence element can be correctly specified to 1 ppm.

In addition, the lower limit of the total concentration of halogen atoms is the detection limit of combustion ion chromatography, i.e., 0.01 ppm. In the present invention, the lower limit of the total concentration of halogen atoms is not zero because of the assumption that halogen atoms are contained.

As described above, the host material is an organic compound having a partial structure in which an aromatic ring and alkyl group are bonded.

Specific examples include the three types represented by the following formulae (1) to (3):

 (1)

wherein R is selected from the above-described alkyl groups and linear and branched alkyl groups having 1 to 6 carbon atoms; n represents an integer of 1 to 10; and Ar is an aromatic ring, more specifically, selected from the above-described pyrene ring and fluorene ring, a phenyl ring, a naphthalene ring, an anthracene ring, a tetracene ring, a pentacene ring, a phenanthrene ring, a picene ring, a chrysene, a perylene ring, a terylene ring, a quaterylene ring, a benzopyrene ring, a benzofluorene ring, a dibenzofluorene ring, a fluoranthene ring, a benzofluoranthene ring, an indenochrysene ring, and a benzoindenochrysene ring, and a plurality of rings may be bonded through a single bond.

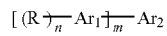 (2)

wherein R is selected from the above-described alkyl groups and linear and branched alkyl groups having 1 to 6 carbon atoms; n represents an integer of 1 to 10; Ar1 is an aromatic ring, more specifically, selected from the above-described pyrene ring and fluorene ring, a phenyl ring, a naphthalene ring, an anthracene ring, a phenanthrene ring, a chrysene, a perylene ring, a benzopyrene ring, a benzofluorene ring, a dibenzofluorene ring, a fluoranthene ring, a benzofluoranthene ring, an indenochrysene ring, and a benzoindenochrysene ring; Ar2 is also an aromatic ring, more specifically, selected from the above-described pyrene ring and fluorene ring, a naphthalene ring, an anthracene ring, a phenanthrene ring, a chrysene, a perylene ring, a benzopyrene ring, a benzofluorene ring, a dibenzofluorene ring, a fluoranthene ring, a benzofluoranthene ring, an indenochrysene ring, and a benzoindenochrysene ring, and a plurality of rings Ar2 may be bonded through a single bond; and m represents an integer of 1 to 3.

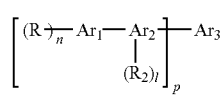 (3)

wherein $R_1$ and $R_2$ are each independently selected from the above-described alkyl groups and linear and branched alkyl groups having 1 to 6 carbon atoms; n represents an integer of 1 to 10; l represent an integer of 1 to 10; Ar1 and Ar2 are aromatic rings, more specifically, each independently selected from the above-described pyrene ring and fluorene ring, a phenyl ring, a naphthalene ring, an anthracene ring, a phenanthrene ring, a chrysene, a perylene ring, a benzopyrene ring, a benzofluorene ring, a dibenzofluorene ring, a fluoranthene ring, a benzofluoranthene ring, an indenochrysene ring, and a benzoindenochrysene p represents an integer of 1 to 3; Ar3 is also an aromatic ring, more specifically, selected from the above-described pyrene ring and fluorene ring, a phenyl ring, a naphthalene ring, an anthracene ring, a phenanthrene ring, a chrysene, a perylene ring, a benzopyrene ring, a benzofluorene ring, a dibenzofluorene ring, a fluoranthene ring, a benzofluoranthene ring, an indenochrysene ring, and a benzoindenochrysene ring, and a plurality of rings Ar3 may be bonded through a single bond.

A purification method for obtaining, with high purity, an organic compound having an alkyl group-containing aromatic ring as the host material is not particularly limited.

Examples of the purification method include a sublimation purification method, a recrystallization method, a reprecipitation method, a column purification method, an adsorption method, a zone melting method, and the like. Further, a combination of these purification methods can be used. The zone melting method is a method in which when a large difference in impurity concentration occurs between a solid state and a liquid state, an impurity concentration gradient is formed by heat melting and re-cooling to separate impurities.

The purification method may be appropriately selected from these methods according to the properties and structure of an organic compound, and the sublimation purification method, the recrystallization method, or the column purification method can be used.

As described above, the organic electroluminescence element of the present invention includes as components at least a pair of electrodes, i.e., the anode and the cathode, and the luminescent layer disposed between the electrodes and composed of an organic compound. There are various layer relations between a pair of electrodes and organic compound layers. Although the various lamination relations are described below, the present invention is not limited these relations.

First mode: anode/luminescent layer/cathode

Second mode: anode/hole injection layer/luminescent layer/cathode

Third mode: anode/luminescent layer/electron injection layer/cathode

Fourth mode: anode/hole injection layer/hole transport layer/luminescent layer/cathode Fifth mode: anode/luminescent layer/electron transport layer/electron injection layer/cathode Sixth mode: anode/hole injection layer/luminescent layer/electron transport layer/electron injection layer/cathode Seventh mode: anode/hole injection layer/hole transport layer/luminescent layer/electron injection layer/cathode Eighth mode: anode/hole injection layer/luminescent layer/electron injection layer/cathode Ninth mode: anode/hole injection layer/hole transport layer/luminescent layer/electron transport layer/electron injection layer/cathode The organic electroluminescence element according to the present invention can have the ninth mode.

The above-described modes are very basic element configurations, and the configuration of the organic electroluminescence element according to the present invention is not limited to these.

Various layer structures, for example, a layer structure in which an insulating layer, an adhesive layer, or an interference layer is provided between an electrode and an organic compound layer, can be used.

Further, one or both of the anode and the cathode may be transparent or semitransparent. Therefore, the light emission direction may be one or both of the electrode sides.

When one of the electrodes is disposed on the light emission side, and the other electrode is disposed on the light reflection side, the other electrode may include a laminate including a transparent electrode and a light reflecting layer. More specifically, the transparent electrode is composed of ITO, and the light reflecting layer is composed of silver or aluminum.

The organic electroluminescence element according to the present invention may be connected to a driving transistor or switching transistor.

A plurality of organic electroluminescence elements according to the present invention may be arranged as pixels in a plane. In this case, an image display device having a display region including an organic electroluminescence element group as a plurality of pixels can be provided.

A plurality of organic electroluminescence elements according to the present invention may be arranged as pixels in a plane. In this case, an imaging apparatus including an imaging portion such as an imaging lens, and a display portion having a display region including an organic electroluminescence element group as a plurality of pixels can be provided.

More specifically, the imaging apparatus is a digital camera, such as a still camera or a video camera.

EXAMPLES

Synthesis and Purification of Compound 1 Used as Host Material

Compound 1 below was synthesized through intermediate 1 and intermediate 2 according to the synthesis scheme described below.

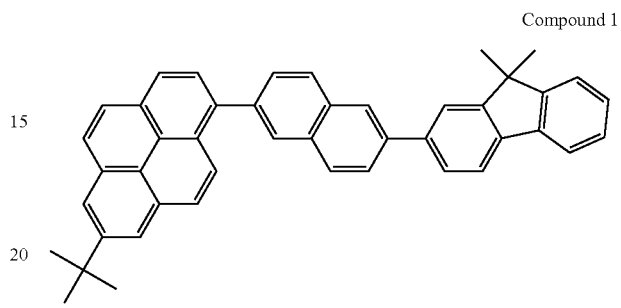

Compound 1

(Synthesis of Intermediate 1)

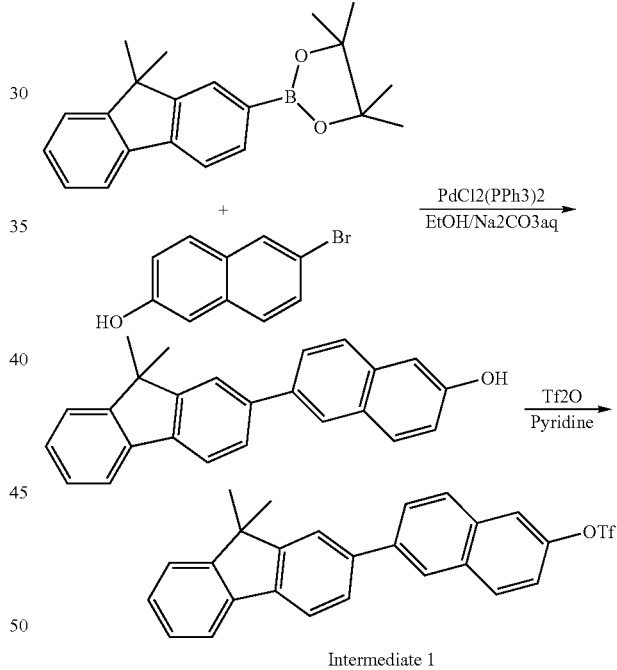

Intermediate 1

In a reaction vessel, 3.17 g (14.2 mmol) of 6-bromo-2-naphthol, 5.00 g (15.6 mmol) of 2-(9,9-dimethyl-9H-fluoren-2-yl)-4,4,5,5-tetramethyl-[1,3,2]dioxaborane, 96.0 ml of ethanol, 6.78 g (21.3 mmol) of sodium carbonate, 48.0 ml of water, and 30 mg ($14.2 \times 10^{-3}$ mmol) of $Pd(PPh_3)_2Cl_2$ were charged. Then, the resultant mixture was stirred under reflux for 4 hours and cooled. Then, water was poured to the mixture, and the mixture was filtered to produce crude crystals. The resulting crude crystals were washed with water and heptane to produce 3.94 g of fluorenylnaphthol in a yield of 82.5%.

Next, 10.5 g (31.2 mmol) of fluorenylnaphthol and 100 ml of pyridine were charged in a reaction vessel, and 15.5 ml (93.6 mmol) of trifluoromethanesulfonic acid anhydride was added dropwise to the mixture in an ice bath. Then, the mixture was stirred for 3 hours, and the reaction solution was poured into iced water and then filtered. The resulting crude crystals were washed with methanol to prepare 6.99 g of intermediate 1 in a yield of 64.7%.

(Synthesis of Intermediate 2)

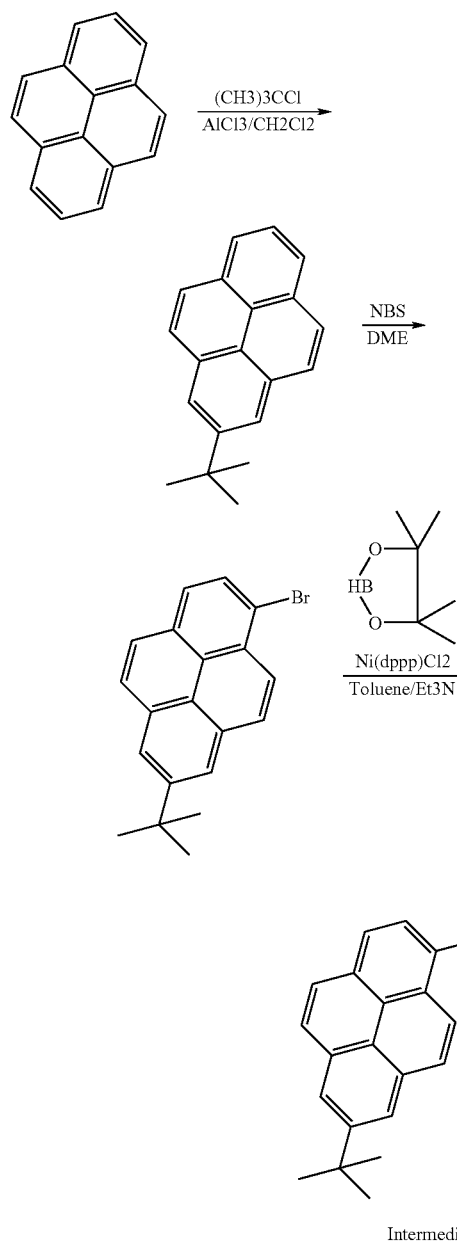

Intermediate 2

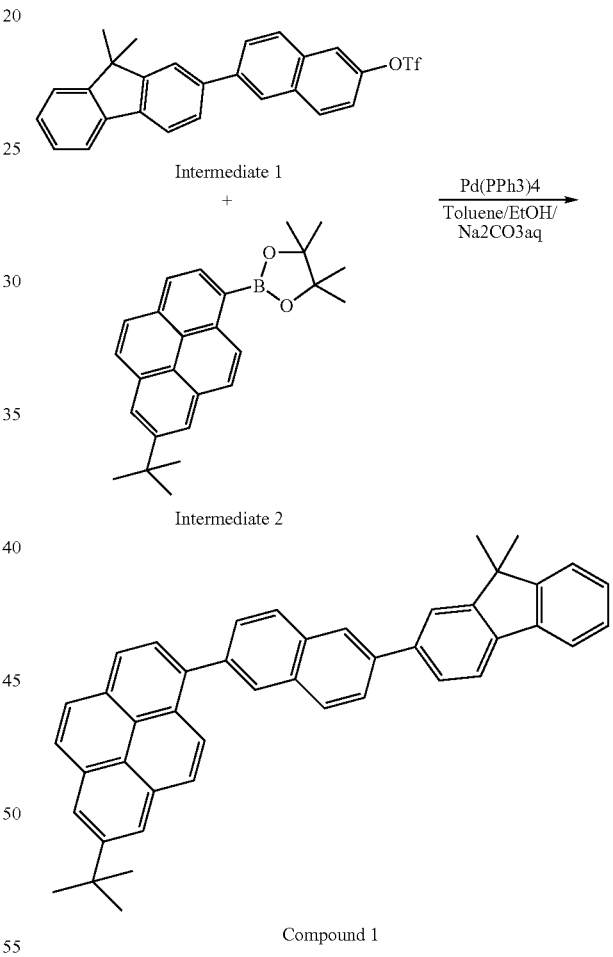

Intermediate 1

Intermediate 2

Compound 1

In a reaction vessel, 50.0 g (0.25 mol) of pyrene, 27.6 g (0.30 mol) of tert-butyl chloride, and 200 ml of methylene chloride were charged, and the resulting mixture was cooled to 0° C. Next, 35.3 g (0.27 mol) of aluminum chloride was charged, followed by stirring at room temperature for 2 hours. Then, iced water and methylene chloride were added, and an organic layer was extracted, washed with water, dried over magnesium sulfate, and recrystallized to produce 33 g of tert-butylpyrene crystals in a yield of 51%.

Next, 25.0 g (0.10 mol) of tert-butylpyrene and 250 ml of DME (1,2-dimethoxyethane) were charged in a reaction vessel, and the mixture was cooled to 0° C. Next, NBS was added in an amount of 4 equivalents relative to tert-butylpyrene, and the resulting mixture was stirred overnight at room temperature, filtered, and recrystallized to produce 29.5 g of bromo-tert-butylpyrene crystals in a yield of 90%.

Next, in a nitrogen atmosphere, 27.0 g (0.08 mol) of bromo-tert-butylpyrene, 26.0 g (0.20 mol) of 4,4,5,5-tetramethyl-1,2,3-dioxaborane, 40.0 g (0.40 mol) of triethylamine, and 3.5 g (6.45 mmol) of Ni(dppp)Cl$_2$ were charged in a reaction vessel, and the resultant mixture was stirred under heating at 100° C. Then, the mixture was cooled, and toluene and water was charged. Then, an organic layer was extracted, dried over sodium sulfate, and filtered, and the filtrate was concentrated. Next, the residue was washed with acetone and methanol and filtered to prepare 22.0 g of intermediate 2 in a yield of 72% with a purity of 99.6% (HPLC: UV 230 nm).

Synthesis of Compound 1

In a reaction vessel, 8.45 g (18.0 mmol) of intermediate 1, 7.63 g (19.8 mmol) of intermediate 2, 0.63 g (0.54 mmol) of Pd(PPh$_3$)$_4$, 3.82 g (36.1 mmol) of sodium carbonate, 126.8 ml of toluene, 25.4 ml of ethanol, and 25.4 ml of water were charged, and the resultant mixture was stirred under reflux for 1 hour. Then, the mixture was cooled, and ethanol was charged. The mixture was filtered to obtain crude crystals. The resultant crude crystals were washed with water and purified with a column to prepare 6.16 g of compound 1 in a yield of 72.8%. Further, the resultant compound 1 was purified by sublimation.

The structure was confirmed by NMR measurement. Peak assignment is shown below.

$^1$H-NMR (500 MHz, CDCl$_3$): δ (ppm)=8.25-8.21 (m, 5H), 8.12-8.10 (m, 4H), 8.07-8.01 (m, 3H), 7.91 (dd, 1H), 7.87 (d, 1H), 7.84-7.76 (m, 4H), 7.48 (d, 1H), 7.40-7.33 (m, 2H), 1.60 (s, 6H) 1.59 (s, 9H)

Halogen atoms, i.e., chlorine atoms, contained in a very small amount were not observed due to the sensitivity of NMR.

(Identification of Halogen Substitution Product of Synthesized Compound 1)

After the hydrocarbon skeleton of compound 1 purified by sublimation was confirmed by NMR, compound 1 was analyzed with high-performance liquid chromatography with tandem mass spectrometry (LC/MS/MS). As a result, it was confirmed that a halogen substitution product is present in compound 1 prepared by the above-mentioned synthesis and purification, and that the halogen substitution product contains chlorine atoms bonded to a pyrene site.

The liquid chromatography with tandem mass spectrometer is an apparatus in which a high-performance liquid chromatography and tandem mass spectrometry capable of MS/MS measurement are directly connected to each other. The MS/MS method includes measurement of fragments, which are separated in a first analytical system, in a second analytical system, and is mass spectrometry capable of detecting fragments with smaller molecular weights and of easily analyzing the structure of a sample. As the liquid chromatography with tandem mass spectrometer, an apparatus in which a high-performance liquid chromatographic apparatus Agilent 1100 manufactured by Agilent Technologies Inc. and tandem mass spectrometer LTQ Orbitrap XL manufactured by Thermofisher Scientific Inc. were directly connected was used.

The structure of the halogen substitution product contained in synthesized compound 1 is represented by compound 2 below.

Compound 2

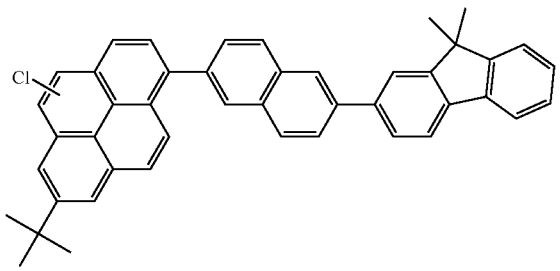

(Measurement of Halogen Atom Concentration)

The content of a chlorine substitution product as the halogen substitution product was measured by high-performance liquid chromatography, and the chlorine ion concentration as the halogen atom concentration was measured by combustion ion chromatography.

A relative concentration ratio was first calculated by high-performance liquid chromatography.

In high-performance liquid chromatography, LC-2000 plus series (detector: UV-2075, PL-2025) manufactured by JASCO Corporation was used.

In high-performance liquid chromatography, compound 2 contained in compound 1 was detected only by an emission detector (PL detector) but not detected by an absorptiometric detector (UV/VIS detector) because the content of compound 2 was very low. Therefore, a relative concentration ratio was calculated by Equation (4).

Relative concentration ratio (%)=[area $PL$(compound 2)/area $UV$(compound 1)]×100       Equation (4)

As a measurement sample, a solution of 1 mg sample in 5 ml chloroform was prepared.

In high-performance liquid chromatography, measurement was performed at 254 nm with the absorptiometric detector and at an excitation wavelength of 354 nm and an emission wavelength of 416 nm with the emission detector.

Next, in combustion ion chromatography, a calibration curve was first formed.

The apparatus used was a system in which automatic sample combustion apparatus AQF-100 manufactured by Dia Instruments Co., Ltd. and ion chromatograph ICS-1500 manufactured by Dionex Co., Ltd. were combined. An absorption solution was prepared by diluting a 30 ppm hydrogen peroxide solution with ultrapure water, and a calibration curve of chlorine ions was formed using the absorption solution, bromine (sodium bromide) as internal standard ions, and sodium chloride. Next, 30 mg of a sample was measured, and the concentration of chlorine ions bonded to an organic compound contained in the sample was calculated by subtracting the chlorine ion concentration of a blank.

The relative concentration ratios of the chlorine-substitution product (compound 2) contained in compound 1, which were calculated by high-performance liquid chromatography, were plotted in ordinate, and the results of chlorine ion concentration measured by combustion ion chromatography were plotted in abscissa to form a graph as a calibration curve. The calibration curve is shown in FIG. 1.

FIG. 1 indicates that the chlorine ion concentration and the relative concentration ratio have a linear relationship.

(Measurement of Concentration of Chlorine Substitution Product Contained in Powder and Evaporated Film)

The concentration of the chlorine-substitution product (compound 2) contained in compound 1 prepared by sublimation purification was measured by high-performance liquid chromatography, and the relative concentration ratio was calculated by Equation (1). In this case, compound 1 was a powder.

Apart from measurement of powder compound 1, compound 1 prepared by sublimation purification was deposited by evaporation to form a film, and the concentration of compound 2 contained in the evaporated film was measured by high-performance liquid chromatography.

The evaporated film was formed using a deposition machine (EBH-6 manufactured by ULVAC) for forming an organic compound layer of an organic electroluminescence element.

A film was formed to a thickness of 600 Å on a glass substrate of 75 mm×75 mm at an evaporation rate of 1.0 Å/sec. The resulting evaporated film was dissolved in 2 ml of chloroform, and the relative concentration ratio shown by Equation (1) was measured by high-performance liquid chromatography. The results are shown in Table 1 and FIG. 2. The relative concentration ratio was measured by high-performance liquid chromatography under the same conditions as those for measuring the concentration of the chlorine substitution product, i.e., at 254 nm with the absorptiometric detector and at an excitation wavelength of 354 nm and an emission wavelength of 416 nm with the emission detector.

Three samples, i.e., Sample 1, Sample 2, and Sample 3, were measured for each of powder compound 1 and the evaporated film of compound 1.

Sample 1, Sample 2, and Sample 3 were different in the content of compound 2 in compound 1. The relative concentration ratio of the chlorine substitution product contained in each of the samples was measured in a powder state and an evaporated film state.

TABLE 1

Relative concentration ratio of chlorine substitution product

|  | Powder (%) | Evaporated film (%) |
| --- | --- | --- |
| Sample 1 | Undetected | Undetected |
| Sample 2 | 0.056 | 0.060 |
| Sample 3 | 1.265 | 1.280 |

It was confirmed from Table 1 that the relative concentration ratio of the chlorine substitution product contained in a powder sample is the same as that in the evaporated film.

Figure 2:
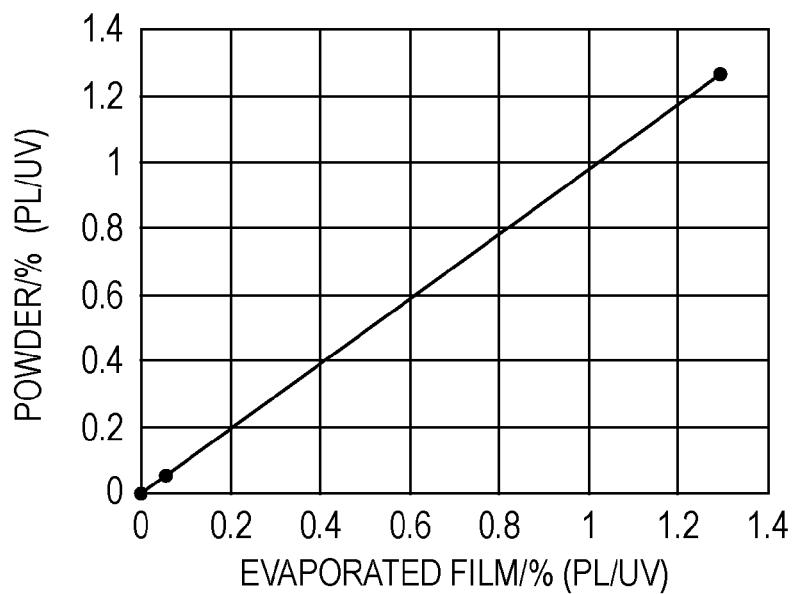
FIG. 2 is a graph showing a relationship between the concentration ratios of a chlorine substitution product contained in powder and an evaporated film.

FIG. 2 is a graph showing a relationship between the three samples shown in Table 1, in which the relative concentration ratio of the chlorine substitution product contained in the evaporated film is shown in abscissa, and the relative concentration ratio of the chlorine substitution product contained in the powder is shown in ordinate. This graph indicates a linear relationship between the three samples.

Therefore, it was confirmed that the concentration of the chlorine substitution product contained in a powder sample prepared by sublimation purification is substantially the same as that in the evaporated film.

Therefore, the concentration of a halogen substitution product contained in an organic compound which is recovered from a manufactured organic electroluminescence element and purified can be measured using the calibration curve obtained.

Example 1

A blue light-emitting organic electroluminescence element in the ninth mode was formed by the method described below.

Indium tin oxide (ITO) was deposited on a glass substrate by sputtering to form an anode. The thickness of the anode was 120 nm. Next, the substrate with the anode was successively ultrasonically washed with acetone and isopropyl alcohol (IPA), washed with pure water, and then dried. Then, the substrate was washed with UV/ozone and used as a transparent conductive support substrate.

Next, a hole injection material, compound E-1, shown below and not containing a halogen substitution product was mixed with chloroform to prepare a chloroform solution of 0.1% by weight.

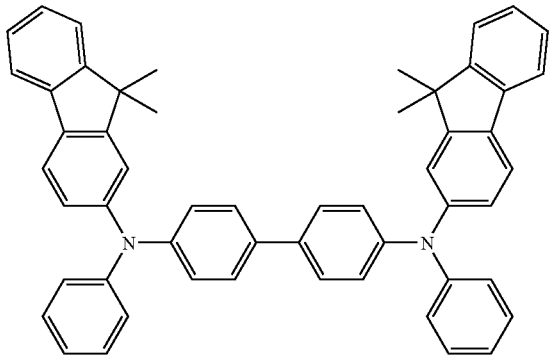

Compound E-1

The chloroform solution was added dropwise onto the anode, and a film was formed by spin coating first at a rotational speed of 500 rpm for 10 seconds and then at a rotational speed of 1000 rpm for 40 seconds. Then, the film was dried in a vacuum oven at 80° C. for 10 minutes to completely remove the solvent in the thin film, forming a hole injection layer. The thickness of the hole injection layer was 15 nm.

Next, Compound E-2 shown below and not containing a halogen substitution product was deposited on the hole injection layer by vacuum evaporation to form a hole transport layer. The thickness of the hole transport layer was 15 nm.

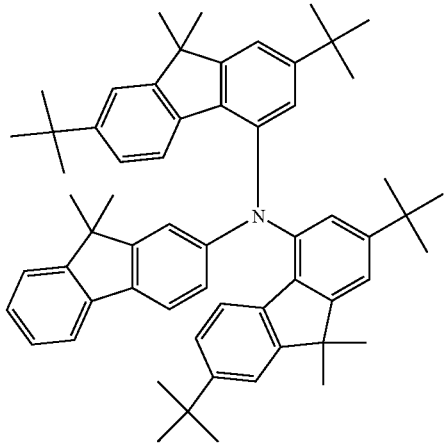

Compound E-2

Next, Compound E-3 as a guest material (luminescent material) shown below and not containing a halogen substitution product and Compound 1 as a host material were co-deposited by vacuum evaporation so that the weight ratio was 5:95, forming a luminescent layer. The deposition was performed under conditions in which the thickness of the luminescent layer was 30 nm, the degree of vacuum in evaporation was $1.0 \times 10^{-4}$ Pa, and the deposition rate was 0.1 nm/sec to 0.2 nm/sec. Both the host material and the guest material were composed of only carbon and hydrogen.

HOMO and LUMO of Compound 1 are the following values: HOMO is 5.72 and LUMO is 2.70. HOMO and LUMO of Compound E-3 are the following values: HOMO is 5.87 and LUMO is 3.06.

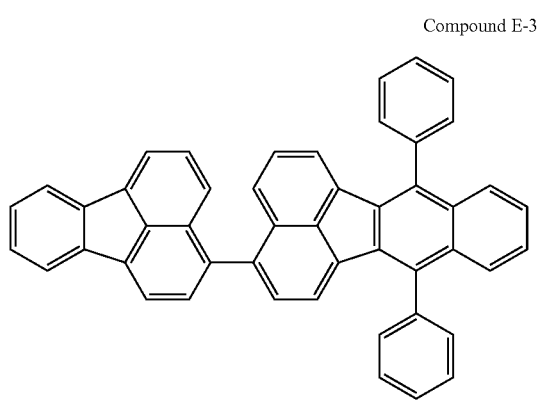

Compound E-3

Next, 2,9-bis[2-(9,9'-dimethylfluorenyl)]-1,10-phenanthroline not containing a halogen substitution product was deposited on the luminescent layer by vacuum evaporation to form an electron transport layer. The deposition was performed under conditions in which the thickness of the electron transport layer was 30 nm, the degree of vacuum in evaporation was $1.0\times10^{-4}$ Pa, and the deposition rate was 0.1 nm/sec to 0.2 nm/sec.

Next, lithium fluoride (LiF) was deposited on the electron transport layer by vacuum evaporation to form an electron injection layer. The deposition was performed under conditions in which the thickness of the electron injection layer was 0.5 nm, the degree of vacuum in evaporation was $1.0\times10^{-4}$ Pa, and the deposition rate was 0.01 nm/sec. Next, an aluminum film was formed by vacuum evaporation to form a cathode. The deposition was performed under conditions in which the thickness of the cathode was 150 nm, the degree of vacuum in evaporation was $1.0\times10^{-4}$ Pa, and the deposition rate was 0.5 nm/sec to 1.0 nm/sec.

Next, the substrate was covered with a protective glass plate in a dry air atmosphere so as to prevent deterioration of the element due to moisture adsorption, and then sealed with an acrylic resin adhesive. The organic electroluminescence element was formed as described above.

The organic electroluminescence element was disassembled, and the organic compound layers disposed between the anode and the cathode were recovered. As a result of measurement of the total concentration of halogen atoms in the organic compound layers using the calibration curve, the halogen atoms were not detected.

Example 2 and Comparative Examples 1 to 3

Example 2 and Comparative Examples 1 to 3 were different from Example 1 in that the content of Compound 2 as the halogen substitution product contained in Compound 1 as the host material was different. The other conditions were the same as in Example 1.

As a reference example, when the chlorine ion concentration in an organic electroluminescence element having the same layered structure as in the examples and comparative examples is estimated to 500 ppm, it is thought that the relative luminance ratio is extremely low and far less than 0.01.

Table 2 shows the chlorine ion concentrations determined using the calibration curve.

TABLE 2

Relation between chlorine ion concentration and characteristics of organic electroluminescence element

| | | | @ 2000 cd/m² | | |
| --- | --- | --- | --- | --- | --- |
| | Chlorine ion concentration (ppm) | Relative concentration ratio (%) | Current efficiency (cd/A) | External quantum efficiency (%) | Relative luminance ratio $L/L_0$ |
| Example 1 | Undetected | Undetected | 9.04 | 5.9 | 0.90 |
| Example 2 | 0.9 | 0.04 | 9.09 | 5.9 | 0.90 |
| Comparative Example 1 | 3.6 | 1.29 | 8.81 | 5.8 | 0.81 |
| Comparative Example 2 | 21.9 | 8.93 | 8.40 | 5.7 | 0.60 |
| Comparative Example 3 | 30.0 | 11.88 | 9.31 | 5.9 | 0.55 |

In Table 2, $L/L_0$ is a value which represents a relative luminance ratio of luminance 100 hours after to the initial luminance when the manufactured organic electroluminescence element was continuously driven at a constant current (100 mA/cm²). Therefore, the closer to 1.0 the value is, the less the element deteriorates.

According to these results, the initial efficiency and relative luminance ratio of Example 1 are equivalent to those of Example 2. In addition, the relative luminance ratio is 0.9 or more and significantly high.

In contrast, in Comparative Examples 1 to 3, the initial efficiency is low, and the relative luminance ratio is also a low value of less than 0.9.

Although not shown in Table 2, in the reference example, i.e., when the chlorine ion concentration is 500 ppm, the relative luminance ratio is an extremely low value of far below 0.01 as compared with Examples 1 and 2 and Comparative Examples 1 to 3.

Example 3

Synthesis of Compound 3

Compound 3 of the following structural formula was synthesized.

Compound 3

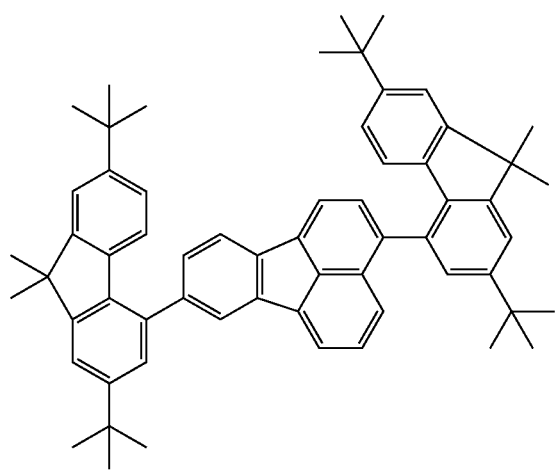

The reaction scheme was as follows:

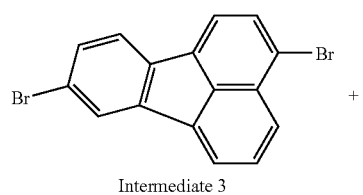

Intermediate 3

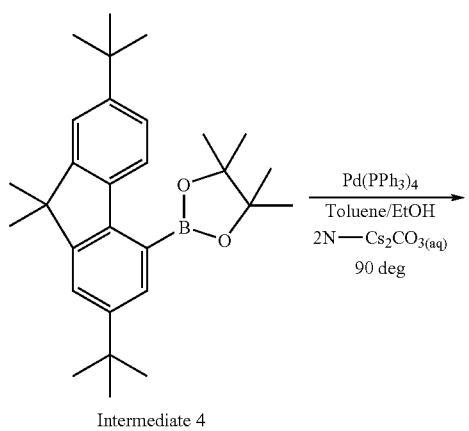

Intermediate 4

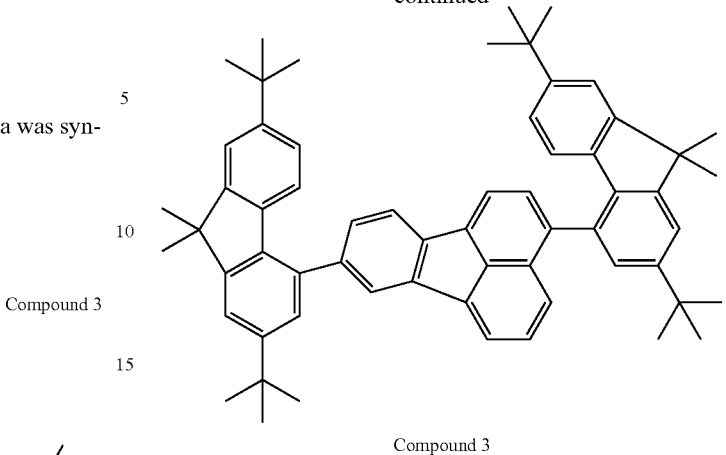

Compound 3

In a reaction vessel, 500 mg (1.39 mmol) of intermediate 3, 1.28 g (3.06 mmol) of intermediate 4, toluene (80 ml), an aqueous cesium carbonate solution (cesium carbonate 2 g, distilled water 15 ml), ethanol (40 ml), and 321 mg (0.278 mmol) of $Pd(PPh_3)_4$ were charged, and the resultant mixture was heated to 90° C. and stirred at the same temperature for 5 hours. After the mixture was cooled to room temperature, extraction with toluene was performed, and an organic layer was purified by column chromatography (mobile phase; toluene:heptane=1:3) to obtain 780 mg of compound 3 in a yield of 69%. The resultant Compound 3 was further purified by sublimation.

The structure was confirmed by NMR measurement. Peak assignment is shown below.

$^1$H-NMR (500 MHz, $CDCl_3$): δ (ppm)=8.10 (br, 3), 7.93 (d, 1H, J=7.0 Hz), 7.73 (d, 1H, J=7.0 Hz), 7.62-7.33 (m, 9H), 7.11 (br, 1H), 7.02 (br, 1H), 6.84 (br, 1H), 6.38 (br, 1H), 1.60 (s, 3H), 1.58 (s, 3H), 1.57 (br, 6H), 1.44 (s, 9H), 1.43 (s, 9H), 1.30 (br, 6H), 1.25 (br, 6H)

(Measurement of Halogen Concentration)

The concentration of halogen atoms was measured by combustion ion chromatography in the same manner as in Example 1. The results are shown in Table 3.

In this example, a hole block layer containing compound 3 was formed between a luminescent layer and an electron transport layer. The other conditions for a blue light-emitting organic electroluminescence element were the same as in Example 1.

The thickness of the hole block layer was 10 nm. The hole block layer was formed under conditions in which the degree of vacuum in evaporation was $1.0 \times 10^{-4}$ Pa and the deposition rate was 0.1 nm/sec to 0.2 nm/sec.

Example 4

In this example, the concentration of halogen atoms in a hole block layer was different from that in the blue light-emitting organic electroluminescence element of Example 3. The other conditions were the same as in Example 3.

TABLE 3

Compound 3: Relation between halogen ion concentration and characteristics of organic electroluminescence element

| | | | @ 2000 cd/m² | | |
|---|---|---|---|---|---|
| | Chlorine ion concentration (ppm) | Bromine ion concentration (ppm) | Current efficiency (cd/A) | External quantum efficiency (%) | Relative luminance ratio $L/L_0$ |
| Example 3 | 0.2 | 0.5 | 9.5 | 6.2 | 0.90 |
| Example 4 | 0.4 | 0.5 | 9.1 | 6.2 | 0.90 |
| Comparative Example 4 | 3.8 | 3.5 | 8.9 | 5.9 | 0.78 |
| Comparative Example 5 | 4.9 | 2.3 | 9.4 | 5.8 | 0.79 |
| Comparative Example 6 | 1.6 | 68.2 | 8.8 | 5.8 | 0.10 |

According to these results, the initial efficiency and relative luminance ratio of Example 3 are equivalent to those of Example 4. In addition, the relative luminance ratios are relatively high.

In contrast, in Comparative Examples 4 to 6, the initial efficiency is low, and the relative luminance ratio is also a low value.

Example 5

Compound 4 having the following structure was synthesized.

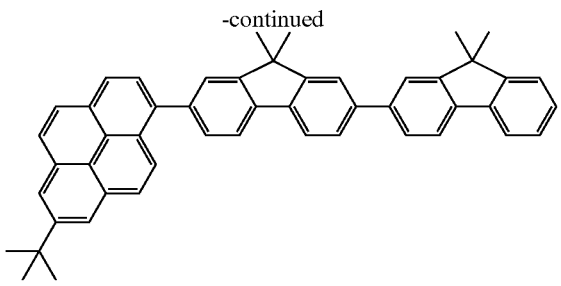

Compound 4

Synthesis of Compound 4

In a reaction vessel, 698 mg (1.5 mmol) of intermediate 5, 576 mg of intermediate 2, 100 mg of Pd(PPh$_3$)$_4$, an aqueous sodium carbonate solution (sodium carbonate 3.2 g, distilled water 15 ml), 15 ml of toluene, and 7.5 ml of ethanol were charged. The resultant mixture was stirred in a nitrogen stream at 80° C. for 8 hours. After reaction was terminated, the reaction solution was extracted with toluene, and an organic layer was purified by column chromatography (mobile phase; toluene). Then, recrystallization was performed to obtain 570 mg of compound 4 in a yield of 59.1%. The resultant compound 4 was further purified by sublimation.

The structure was confirmed by NMR measurement. Peak assignment is shown below.

$^1$H-NMR (500 MHz, CDCl$_3$): δ (ppm)=8.27 (d, 1H), 8.23 (m, 3H), 8.01 (s, 2H), 8.04 (m, 2H), 7.94 (d, 1H), 7.90 (d, 1H), 7.83 (d, 1H), 7.79-7.65 (m, 7H), 7.48 (m, 1H), 7.36 (m, 2H), 1.67 (s, 6H), 1.60 (s, 9H), 1.59 (s, 6H)

(Measurement of Halogen Concentration)

The concentration of halogen atoms was measured by combustion ion chromatography in the same manner as in Example 1. The results are shown in Table 4.

A blue light-emitting organic electroluminescence element was formed by the same method as in Example 1 except that compound 4 was used as the host material in place of compound 1.

The reaction scheme was as follows:

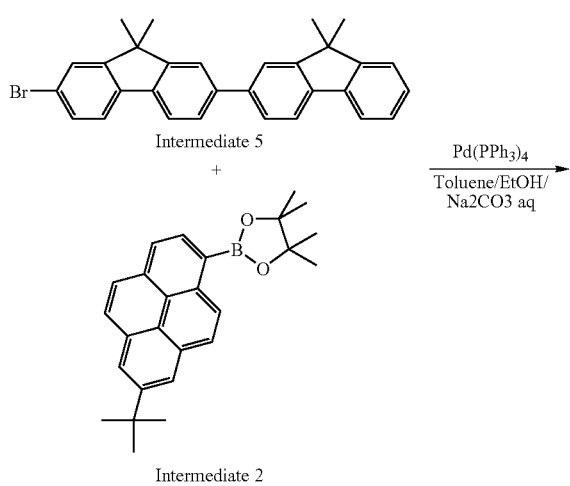

Comparative Example 7

A blue light-emitting organic electroluminescence element was formed by the same method as in Example 5 except that compound 4 was used as the host material in place of compound 1, and a sample having a different content of halogen atoms in compound 4 was used.

The measurement results of Example 5 and Comparative Example 7 are shown in Table 4.

TABLE 4

Compound 4: Relation between chlorine ion concentration and characteristics of organic electroluminescence element

|  | | | @ 2000 cd/m² | | |
|---|---|---|---|---|---|
|  | Chlorine ion concentration (ppm) | Bromine ion concentration (ppm) | Current efficiency (cd/A) | External quantum efficiency (%) | Relative luminance ratio $L/L_0$ |
| Example 5 | 0.8 | Undetected | 6.9 | 4.6 | 0.88 |
| Comparative Example 7 | 3.3 | 28.5 | 6.0 | 4.3 | 0.74 |

According to these results, the relative luminance ratio of Example 5 is high.

In contrast, in Comparative Example 7, the initial efficiency is low, and the relative luminance ratio is also a low value.

Example 6

In Example 6, Compound 5 having the following structure was synthesized. The reaction scheme was as follows:

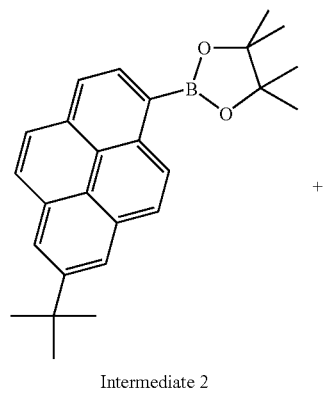

Intermediate 2

+

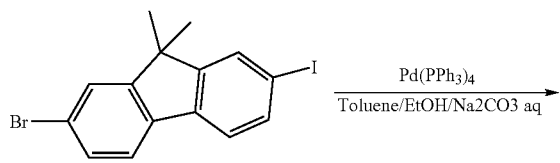

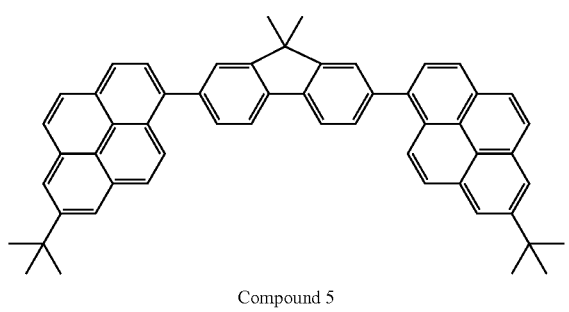

Compound 5

Synthesis of Compound 5

In a reaction vessel, 600 mg (1.50 mmol) of 2-bromo-7-iodo-9,9-dimethylfluorene, 1.17 g (3.04 mmol) of intermediate 2, toluene (60 ml), an aqueous sodium carbonate solution (sodium carbonate 1.5 g, distilled water 30 ml), ethanol (30 ml), and 80 mg (0.067 mmol) of $Pd(PPh_3)_4$ were charged, and the resultant mixture was heated to 80° C. and stirred at the same temperature for 19 hours. After reaction was terminated, the reaction solution was extracted with toluene, and an organic layer was purified by column chromatography (mobile phase; toluene:heptane=1:4) to obtain 450 mg of compound 5 in a yield of 20.9%. The resultant compound 5 was further purified by sublimation.

The structure was confirmed by NMR measurement. Peak assignment is shown below.

$^1$H-NMR (500 MHz, $CDCl_3$): δ(ppm)=8.29 (d, 2H), 8.24-8.22 (m, 4H), 8.10 (s, 4H), 8.07 (d, 2H), 8.05 (d, 2H), 8.00 (d, 2H), 7.76 (s, 2H), 7.69 (dd, 2H), 1.69 (s, 6H), 1.60 (s, 18H), 1.50 (d, 2H)

(Measurement of Halogen Concentration)

The concentration of halogen atoms was measured by combustion ion chromatography in the same manner as in Example 1. The results are shown in Table 5.

A blue light-emitting organic electroluminescence element was formed by the same method as in Example 1 except that compound 5 was used as the host material in place of compound 1.

Comparative Example 8

A blue light-emitting organic electroluminescence element was formed by the same method as in Example 6 except that a sample having a different content of halogen atoms in compound 5 was used.

The measurement results of Example 6 and Comparative Example 8 are shown in Table 5.

TABLE 5

Compound 5: Relation between chlorine ion concentration and characteristics of organic electroluminescence element

| | | | @ 2000 cd/m² | | |
|---|---|---|---|---|---|
| | Chlorine ion concentration (ppm) | Bromine ion concentration (ppm) | Current efficiency (cd/A) | External quantum efficiency (%) | Relative luminance ratio $L/L_0$ |
| Example 6 | 0.5 | Undetected | 7.9 | 4.8 | 0.94 |
| Comparative Example 8 | 4.4 | 12.6 | 7.9 | 4.7 | 0.60 |

According to these results, the relative luminance ratio of Example 6 is as high as 0.9 or more.

In contrast, in Comparative Example 8, the initial efficiency is low, and the relative luminance ratio is also a low value.

Example 7

Compound 6 used in Example 7 and having the following structure was synthesized. The reaction scheme was as follows:

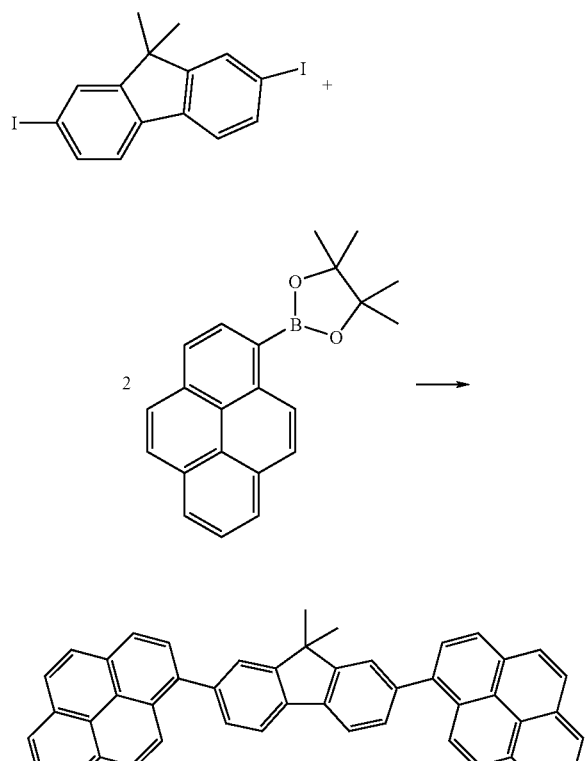

Synthesis of Compound 6

In a nitrogen atmosphere, in a 5-L reaction vessel, intermediate 6 (130 g, 0.29 mol, 1.0 eq), intermediate 7 (210 g, 0.64 mol, 2.2 eq), toluene (2.6 L), ethanol (0.43 L), an aqueous sodium carbonate solution (sodium carbonate 77.2 g, ion exchanged water 0.46 ml), and Pd(PPh$_2$)$_2$Cl$_2$ (2.0 g, 2.91 mmol, 0.01 eq) were charged, and the resultant mixture was stirred under heating at the reflux temperature for 5.5 hours. After reaction was terminated, the reaction solution was allowed to cool and filtered, and then the product was washed in order with water, acetone, and toluene to obtain a gray solid (157 g, yield 90.8%).

Next, silica gel column chromatography was performed, and further slurry washing with toluene was performed to obtain compound 6 as a white solid (119 g, yield 68.4%). Finally, the resultant compound 6 was purified by sublimation.

The structure was confirmed by NMR measurement. Peak assignment is shown below.

$^1$H-NMR (500 MHz, CDCl$_3$): δ (ppm)=8.32 (d, 2H), 8.28 (d, 2H), 8.22 (d, 2H), 8.20 (d, 2H), 8.15-8.08 (m, 8H), 8.04 (d, 2H), 8.1 (d, 2H), 7.77 (s, 2H), 7.70-7.68 (d, 2H), 1.69 (s, 6H)

(Measurement of Halogen Concentration)

The concentration of halogen atoms was measured by combustion ion chromatography in the same manner as in Example 1. The results are shown in Table 6.

Compound 7 and compound 8 serving as green light-emitting dopants used in Example 7 and Comparative Examples 9 to 11 were synthesized. The reaction scheme is shown below.

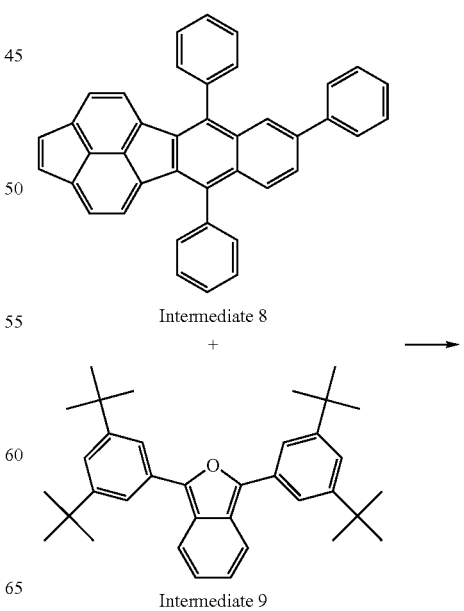

Intermediate 8

+

Intermediate 9

-continued

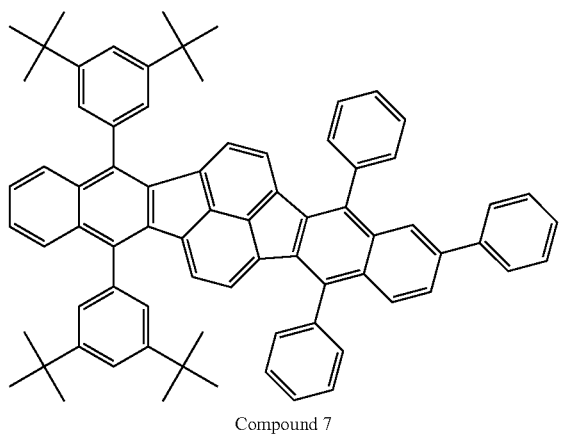

Compound 7

Synthesis of Compound 7

In an argon atmosphere, in a 500 mL reaction vessel, intermediate 8 (18.3 g, 36.2 mmol, 1.0 eq), intermediate 9 (23.3 g, 47.1 mmol, 1.3 eq), and dehydrated toluene (200 mL) were charged, and the resultant mixture was stirred at a bath temperature of 100° C. for 1 hour. Then, TsOH.H$_2$O (1.38 g, 72.4 mmol, 0.2 eq) was added to the mixture, and the mixture was further stirred at a bath temperature of 100° C. for 2 hours. Then, heating was stopped, and the product was purified by silica gel column chromatography to obtain a black solid (39.6 g, LC purity 99.7%).

Next, dehydrated toluene (1.6 L) was added to the black solid (39.6 g) and Galeon Earth (activated white clay) (39.6 g), and the resultant mixture was stirred under reflux for 1 hour, allowed to cool, and then filtered to obtain a pink solution (LC purity 99.7%). The resultant pink solution was subjected to adsorption treatment with silica gel (400 g) and then purified by alumina column chromatography to obtain compound 7 as a yellow solid (38.9 g, LC purity 99.8%). Finally, the resultant compound 7 was purified by sublimation.

The structure was confirmed by NMR measurement. Peak assignment is shown below.

$^1$H-NMR (300 MHz, CDCl$_3$): δ (ppm)=7.72 (s, 1H), 7.60-7.49 (m, 18H), 7.38-7.31 (m, 9H), 6.29-6.22 (m, 4H), 1.37 (s, 36H)

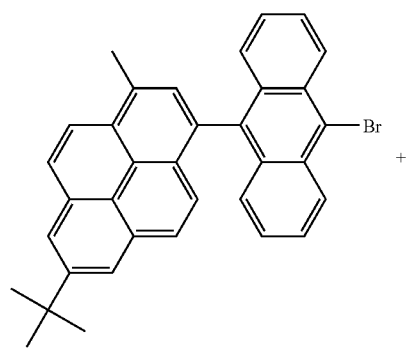

Intermediate 10

-continued

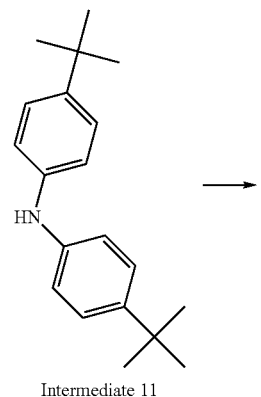

Intermediate 11

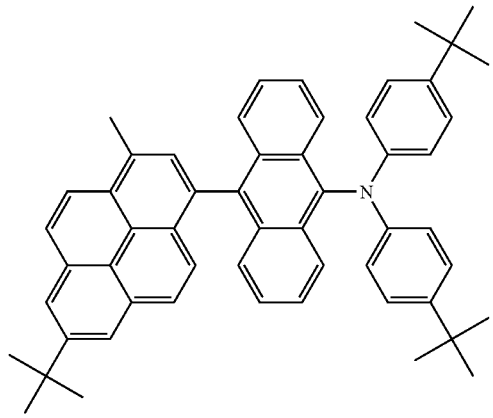

Compound 8

Synthesis of Compound 8

In a nitrogen atmosphere, 344 mg (1.53 mmol) of palladium acetate and 1.86 g (6.12 mmol) of tri-o-tolylphosphine were dissolved in 30 ml of xylene, and the resultant solution was stirred at room temperature for 15 minutes. Then, 100 ml of xylene was added, and 10 g (21.9 mmol) of intermediate 10 was added to the solution, followed by stirring on an oil bath heated to 50° C. for 5 minutes. Then, a solution prepared by dissolving 4.39 g (26 mmol) of intermediate 11 in 30 ml of xylene was added dropwise, and 4.63 g (48.2 mmol) of sodium tert-butoxide was added to the mixture. The resultant mixture was stirred under heating on an oil bath heated to 130° C. for about 5 hours. After the reaction solution was returned to room temperature, 100 ml of water was added to the solution, and an aqueous layer and an organic layer were separated. Further, the aqueous layer was extracted with toluene and ethyl acetate, and an organic layer was added to the previous organic layer and dried over sodium sulfate. The solvent was distilled off, and the residue was purified by silica gel column chromatography (toluene:heptane=1:3) to obtain 8.7 g of compound 8.

The structure was confirmed by NMR measurement. Peak assignment is shown below.

$^1$H-NMR (400 MHz, CDCl$_3$): δ (ppm)=8.37 (d, 1H), 8.28 (sd, 3H), 8.21 (d, 1H), 8.16 (s, 1H), 7.90 (s, 1H), 7.76 (d, 1H), 7.42-7.31 (m, 5H), 7.20-7.10 (m, 10H), 3.05 (s, 3H), 1.59 (s, 9H), 1.31 (s, 9H), 1.28 (s, 9H)

In Example 7, a green light-emitting organic electroluminescence element in the sixth mode was formed by the following method.

An anode and layers up to a hole injection layer were formed by the same methods as in Example 1. Compound 7 as a green light-emitting guest material (luminescent material) not containing halogen and compound 6 as a host material were co-deposited so that the weight ratio was 2:98, thereby forming a luminescent layer having a thickness of 50 nm. As an electron transport layer, 2,9-bis[2-(9,9'-dimethylfluorenyl)]-1,10-phenanthroline was evaporated to a thickness of 40 nm. An electron injection layer and a cathode were formed by the same methods as in Example 1. Comparative Example 9 was the same as Example 7 except that compound 6 having a different halogen content was used. Comparative Example 10 was the same as Example 7 except that green light-emitting compound 8 not containing halogen was used as the guest material. Comparative Example 11 was the same as Example 7 except that green light-emitting compound 8 not containing halogen was used as the guest material, and compound 6 having a different halogen content was used as the host material.

The halogen concentration was measured by the same method as in Example 1.

In addition, compound 6 has a HOMO of 5.75 and a LUMO of 2.83, compound 7 has a HOMO of 5.77 and a LUMO of 3.33, and compound 8 has a HOMO of 5.51 and a LUMO of 3.01.

The measurement results of Example 7 and Comparative Examples 9 to 11 are shown in Table 6.

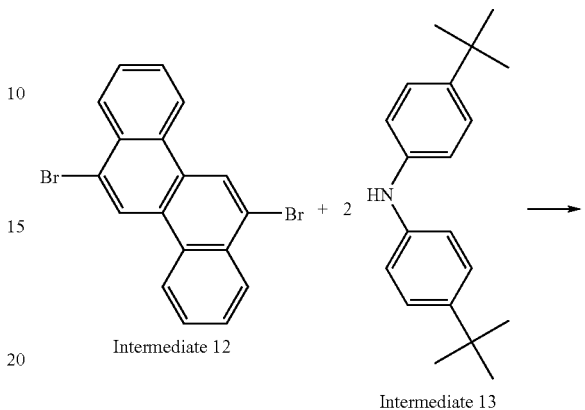

Intermediate 12

Intermediate 13

TABLE 6

Compound 6: Relation between halogen ion concentration and characteristics of organic electroluminescence element

| | Guest material | Host material | Halogen concentration in host material (ppm) | | @ 4000 cd/m² | | |
| --- | --- | --- | --- | --- | --- | --- | --- |
| | | | Chlorine ion concentration | Bromine ion concentration | Current efficiency (cd/A) | External quantum efficiency (%) | Relative luminance ratio (L/L$_0$) |
| Example 7 | Compound 7 | Compound 6 | 0.8 | 0.0 | 19.7 | 5.4 | 0.96 |
| Comparative Example 9 | Compound 7 | Compound 6 | 0.3 | 5.5 | 19.0 | 5.2 | 0.85 |
| Comparative Example 10 | Compound 8 | Compound 6 | 0.8 | 0.0 | 14.2 | 4.0 | 0.84 |
| Comparative Example 11 | Compound 8 | Compound 6 | 0.3 | 5.5 | 14.2 | 4.0 | 0.83 |

According to these results, the relative luminance ratio of Example 7 is as high as 0.9 or more.

In contrast, in Comparative Examples 9 to 11, the relative luminance ratios are low values.

Example 8

Compound 9 used in Example 8 and having a structure below was synthesized. The reaction scheme is shown below.

-continued

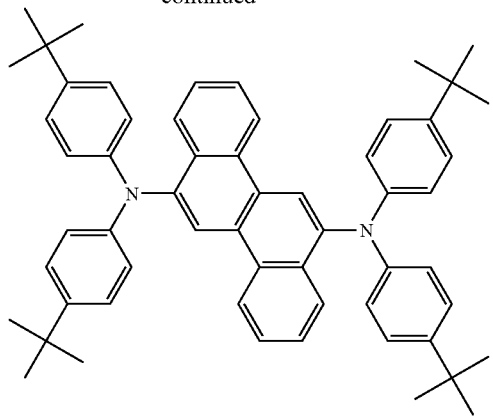

Compound 9

Synthesis of Compound 9

In a nitrogen atmosphere, 0.85 g (2.2 mmol) of intermediate 12, 1.30 g (4.6 mmol) of intermediate 13, 38.4 mg (0.07 mmol) of Pd(dba)$_2$, 96.5 mg (0.14 mmol) of pentaphenyl(di-tert-butylphosphino)ferrocene, and 0.71 g (7.40 mmol) of sodium tert-butoxide were dissolved in 80 ml of toluene, followed by stirring at 80° C. for 23 hours. Then, the resultant mixture was cooled and separated with an aqueous ammonium chloride solution. Next, silica gel column chromatography purification, xylene recrystallization, and toluene recrystallization were performed in order to obtain 0.47 g of compound 9.

The structure was confirmed by NMR measurement. Peak assignment is shown below.

$^1$H-NMR (400 MHz, CDCl$_3$): δ (ppm)=8.57 (sd, 4H), 8.14 (d, 2H), 7.59 (t, 2H), 7.48 (t, 2H), 7.20 (d, 8H), 7.06 (d, 8H), 1.29 (s, 36H)

In addition, compound 9 has a HOMO of 5.48 and a LUMO of 2.70.

In Example 8 and Comparative Example 12, a blue light-emitting organic electroluminescence element was formed by the same method as in Example 1 except that a sample having a different content of halogen atoms in compound 1 was used. In Comparative Example 13, a blue light-emitting organic electroluminescence element was formed by the same method as in Example 1 except that compound 9 not containing halogen atoms was used as the guest material and the same compound as in Example 8 was used as the host material. In Comparative Example 14, a blue light-emitting organic electroluminescence element was formed by the same method as in Example 1 except that compound 9 not containing halogen atoms was used as the guest material and the same compound 1 as in Comparative Example 12 was used as the host material.

TABLE 7

Relation between halogen ion concentration and characteristics of organic electroluminescence element

| | | | | @ 2000 cd/m$^2$ | | |
| --- | --- | --- | --- | --- | --- | --- |
| | | Halogen concentration in host material (ppm) | | Current | External quantum | Relative luminance |
| Guest material | Host material | Chlorine ion concentration | Bromine ion concentration | efficiency (cd/A) | efficiency (%) | ratio (L/L$_0$) |
| Example 8 | Compound E-3 | Compound 1 | 0.8 | 0.0 | 9.1 | 5.9 | 0.90 |
| Comparative Example 12 | Compound E-3 | Compound 1 | 3.7 | 0.0 | 8.8 | 5.8 | 0.81 |
| Comparative Example 13 | Compound 9 | Compound 1 | 0.8 | 0.0 | 6.2 | 4.7 | 0.20 |
| Comparative Example 14 | Compound 9 | Compound 1 | 3.7 | 0.0 | 6.1 | 4.5 | 0.20 |

According to these results, the relative luminance ratio of Example 8 is as high as 0.9 or more.

In contrast, in Comparative Examples 12, 13, and 14, the relative luminance ratios are low values.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions. This application claims the benefit of Japanese Patent Application No. 2008-197970 filed Jul. 31, 2008 and Japanese Patent Application No. 2009-149070 filed Jun. 23, 2009, which are hereby incorporated by reference herein in their entirety.

What is claimed is:

1. An organic electroluminescence element comprising an anode, a cathode, a luminescent layer containing an organic compound, and an organic compound layer other than the luminescent layer, the luminescent layer and the other organic compound layer being disposed between the anode and the cathode so that light is emitted from the luminescent layer by charge injection from the anode and the cathode, wherein the luminescent layer includes a host material and a guest material;

both the host material and the guest material are organic compounds composed of only carbon and hydrogen;

the host material is any one of organic compounds represented by the formulas (1), (2) and (3):

wherein R is selected from linear and branched alkyl groups having 1 to 6 carbon atoms; n represents an integer of 1 to 10; and Ar is selected from a pyrene ring, a fluorene ring and a naphthalene ring,

wherein R is selected from linear and branched alkyl groups having 1 to 6 carbon atoms; n represents an integer of 1 to 10; Ar$_1$ and Ar$_2$ are each independently selected from a pyrene ring, a fluorene ring and a naphthalene ring; and m represents an integer of 1 to 3,

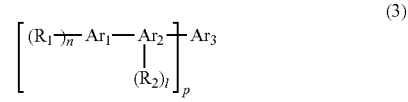

wherein R$_1$ and R$_2$ are each independently selected from linear and branched alkyl groups having 1 to 6 carbon atoms; n represents an integer of 1 to 10; l represents an integer of 1 to 10; Ar$_1$ and Ar$_2$ are each independently selected from a pyrene ring, a fluorene ring and a naphthalene ring; p represents an integer of 1 to 3; and Ar₃ is selected from a pyrene ring, a fluorene ring and a naphthalene ring; and the concentration of halogen atoms contained in at least the luminescent layer is 1 ppm or less in terms of the organic compounds contained in the luminescent layer and the other organic compound layer according to combustion ion chromatography.

2. The organic electroluminescence element according to claim 1, wherein the halogen atoms are chlorine atoms.

3. An image display device comprising a display portion including the organic electroluminescence element according to claim 1.

4. An imaging apparatus comprising an imaging portion and a display portion including the organic electroluminescence element according to claim 1.

5. The organic electroluminescence element according to claim 1, wherein the linear and branched alkyl group is tert-butyl.

* * * * *